(12) United States Patent
Lepercq

(10) Patent No.: US 9,904,749 B2
(45) Date of Patent: Feb. 27, 2018

(54) CONFIGURABLE FPGA SOCKETS

(71) Applicant: Synopsys, Inc., Mountain View, CA (US)

(72) Inventor: Etienne Lepercq, Shrewsbury, MA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/622,725

(22) Filed: Feb. 13, 2015

(65) Prior Publication Data
US 2015/0227662 A1  Aug. 13, 2015

Related U.S. Application Data

(60) Provisional application No. 61/939,611, filed on Feb. 13, 2014.

(51) Int. Cl.
*G06F 17/50* (2006.01)

(52) U.S. Cl.
CPC ...... *G06F 17/5027* (2013.01); *G06F 17/5054* (2013.01)

(58) Field of Classification Search
CPC .......................... G06F 17/5027; G06F 17/5054
See application file for complete search history.

(56) References Cited

U.S. PATENT DOCUMENTS

| | | | | |
|---|---|---|---|---|
| 5,574,388 A | * | 11/1996 | Barbier | G06F 15/7867 326/41 |
| 5,794,033 A | * | 8/1998 | Aldebert | G06F 13/4256 326/39 |
| 5,901,279 A | * | 5/1999 | Davis, III | G01R 31/318516 257/202 |
| 6,347,387 B1 | * | 2/2002 | Fischer | G06F 11/277 714/735 |
| 6,470,485 B1 | * | 10/2002 | Cote | G01R 31/318519 324/613 |
| 6,604,230 B1 | * | 8/2003 | Khalid | G06F 17/5027 326/101 |
| 6,708,144 B1 | * | 3/2004 | Merryman | G06F 17/5045 703/14 |
| 6,947,882 B1 | * | 9/2005 | Reblewski | G06F 17/5027 703/23 |
| 6,983,405 B1 | * | 1/2006 | Herron | G01R 31/318519 714/725 |
| 7,072,825 B2 | * | 7/2006 | Wang | G06F 11/261 703/21 |
| 7,127,649 B2 | * | 10/2006 | Leaming | G06F 11/263 714/715 |

(Continued)

FOREIGN PATENT DOCUMENTS

JP    2001141786 A   *   5/2001

*Primary Examiner* — Naum B Levin

(74) *Attorney, Agent, or Firm* — Alston & Bird LLP

(57) ABSTRACT

A method of emulating a circuit design using an emulator is presented. The method includes allocating one or more spare routing resources to one or more field programmable gate array (FPGA) routing sockets when compiling a plurality of FPGAs disposed in the emulator in preparation for emulating the circuit design, and using the one or more spare routing resources to provide one or more routings among the FPGAs in response to one or more changes made to the circuit design.

42 Claims, 6 Drawing Sheets

(56) References Cited

U.S. PATENT DOCUMENTS

| | | | |
|---|---|---|---|
| 7,409,612 B2* | 8/2008 | Van De Logt | G01R 31/318541 324/750.3 |
| 7,512,728 B2* | 3/2009 | Tseng | G06F 13/22 709/236 |
| 7,930,165 B2* | 4/2011 | Weiss | G06F 11/261 703/17 |
| 8,166,437 B2* | 4/2012 | Chen | G06F 17/5054 716/116 |
| 8,356,272 B2* | 1/2013 | Chene | G06F 17/5027 716/106 |
| 8,549,447 B2* | 10/2013 | Eisenstadt | G06F 17/5054 716/100 |
| 8,718,967 B2* | 5/2014 | Filler | G06F 11/263 702/117 |
| 8,838,406 B2* | 9/2014 | Rivoir | G01R 31/31908 324/73.1 |
| 8,949,752 B2* | 2/2015 | Wang | G06F 17/505 703/13 |
| 2002/0091507 A1* | 7/2002 | Tseng | G06F 17/5027 703/24 |
| 2010/0100860 A1* | 4/2010 | Chang | G06F 17/5027 716/111 |
| 2012/0290993 A1* | 11/2012 | Chene | G06F 17/5045 716/106 |

* cited by examiner

CONFIGURABLE FPGA SOCKETS

RELATED APPLICATIONS

This application claims the benefit of U.S. Provisional Application No. 61/939,611 filed Feb. 13, 2014, which is hereby incorporated in its entirety and for all purposes.

BACKGROUND

The present invention relates generally to a computer implemented method and system for emulating a design and in particular to emulating a design using a multitude of FPGAs with faster emulation implementation when the design is changed.

A field programmable gate array provides a multitude of programmable logic circuits that may be configured to emulate a circuit design, hereinafter also referred to as "design under test (DUT)", at higher speed than computer based simulation. Emulation thus provides a way to validate the interface of a circuit design with hardware peripherals such as through a universal serial bus (USB) emulated on the FPGA that may be difficult to test using slower running computer simulation. A compiler software program translates a DUT's representation, such as hardware description language (HDL), netlist, or other description into one or more bitstreams, which may then be loaded into one or more FPGAs to configure the FPGAs to emulate the circuit. The FPGAs may then emulate the logic functions of the DUT in logic circuits on the FPGAs.

For complex circuit designs, the compiler software typically partitions the DUT into a multitude of FPGAs on a printed circuit board, which includes wiring or nets that provide the interconnect between the FPGAs. The compiler program accesses data representing the DUT's circuits, the DUT's speed constraints, and the available FPGA resources in order to partition the design transparently from the perspective of the DUT designer. Compiling an FPGA may thus be quite time consuming, for example, taking many hours, which may create schedule delays for making even minor changes during design.

SUMMARY

One inventive aspect is a method of emulating a circuit design using an emulator. The method includes allocating one or more spare routing resources to one or more field programmable gate array (FPGA) routing sockets when compiling a plurality of FPGAs disposed in the emulator in preparation for emulating the circuit design. The method also includes using the one or more spare routing resources to provide one or more routings among the FPGAs in response to one or more changes made to the circuit design.

Another inventive aspect is a system including a plurality of field programmable gate arrays (FPGAs). The system is operative to compile the plurality of FPGAs in preparation for emulating a circuit design, while the system is invoked to compile the circuit design. The system is also operative to allocate one or more spare routing resources to one or more FPGA routing sockets, and to use the one or more spare routing resources to provide one or more routings in response to one or more changes made to the circuit design.

Another inventive aspect is a non-transitory computer readable storage medium including instructions that when executed by a processor cause the processor to compile the plurality of FPGAs in preparation for emulating a circuit design, while the system is invoked to compile the circuit design. The instructions also cause the processor to allocate one or more spare routing resources to one or more FPGA routing sockets, and to use the one or more spare routing resources to provide one or more routings in response to one or more changes made to the circuit design.

BRIEF DESCRIPTION OF THE DRAWINGS

Various embodiments of the invention are disclosed in the following detailed description and the accompanying drawings.

DETAILED DESCRIPTION

Figure 3:
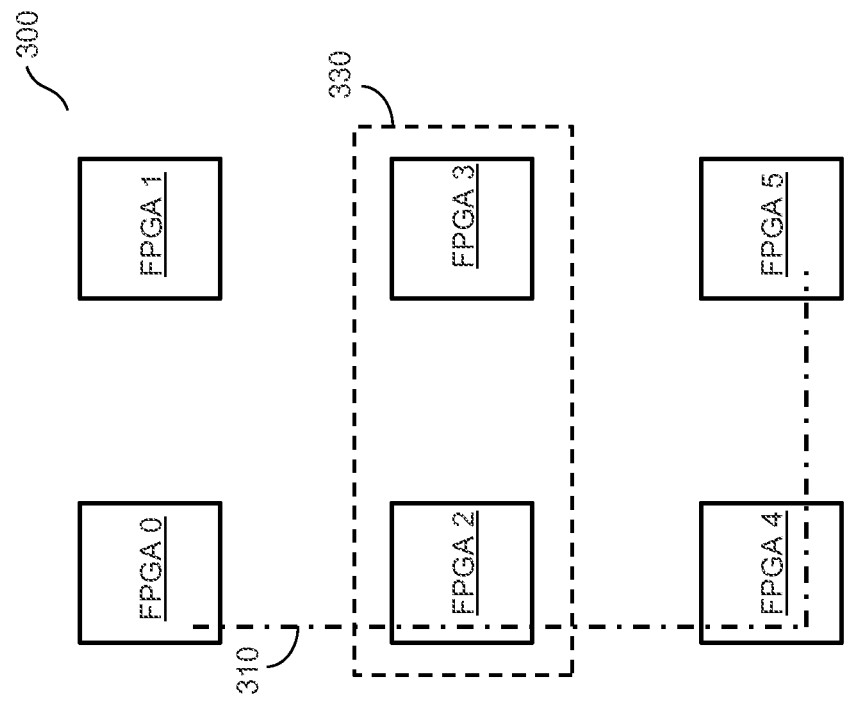
FIG. 3 depicts a simplified exemplary block diagram for an emulation platform with a rerouted global net, in accordance with one embodiment of the present invention.

In accordance with embodiments of the present invention, an emulation platform based on FPGAs may partition a DUT into a multitude of FPGAs. Communication between the FPGAs may be provided by so called "sockets" that are not part of the original user defined DUT but may instead be associated with the input/output (I/O) circuits aboard each FPGA that interface the multitude of FPGAs via the traces on a circuit board. Because there are a limited number of dedicated FPGA I/O circuits, time-multiplexing may be used to send DUT signals over a trace during multiple clock cycles.

A socket is thus not merely an interconnect, but may further include configurable I/O driver circuitry, configurable logic circuits, and configurable interconnect onboard the FPGA and that may be configured via the compiler to route and drive signals off the FPGA chip and/or from one location to another in the same FPGA. In other words, one or more routings that the sockets may configure may include a route from a first FPGA to a second different FPGA or a route from a first portion of a FPGA to a second portion of the same FPGA, the second portion being different from the first portion of the same FPGA. For example, the configurable logic circuits in the socket of the FPGA may support time-multiplexing functionality and connect some of the DUT circuits to the FPGA I/O circuits. A socket may be responsible for sending DUT signals, i.e. an output socket, or for receiving DUT signals, i.e. an input socket. These sockets may multiplex thousands of DUT signals to be sent through a few FPGA I/O circuits.

Routing the DUT signals between the multitude of FPGAs and within the same FPGA may be accomplished by the global routing algorithm in the compiler, which finds a solution to ensure communication between parts of the design across the different FPGAs, while optimizing for emulation speed and the available FPGA resources. The global routing algorithm thus determines, in part, the final frequency of operation of the emulator. It is understood that a global net routed by the global routing algorithm may be a net that is routed across more than one FPGA and does not imply the net is routed to every FPGA in the emulation platform. It is also understood that a global net may not merely be a passive interconnect wire but may also include FPGA I/O and support circuitry associated with sockets as described above.

Given a design compiled to fit the available resources of the multitude of FPGAs and their circuit board, a small local change in the netlist may trigger a compilation of a reduced set of one or more FPGAs using a technique called incremental compile. Preferably, incremental compile compiles only the one or more FPGAs directly impacted by the design change, and no other FPGA. Incremental compile helps to reduce computer farm usage for FPGA compilation. However, incremental compile may lose many of its advantages because of global routing, when a DUT change precipitates changes to global signal routing, even to signals that are not directly impacted by the DUT design change. The new route of a global signal may change most sockets traversed by that global signal, which may in turn trigger many FPGAs to be fully recompiled, while just sockets have changed, thus reducing the main advantage of incremental compilation: reduction of computer farm usage for FPGA compilation.

Embodiments of the present invention provide a technique to prevent recompiling an FPGA when only sockets have changed as a result of global routing finding a new solution. Embodiments of the present invention provide for keeping global routing in incremental compilation as well as in modular compilation flow, enabling emulation to run at best speed even after several incremental compilations are performed. In modular compilation flow, given a design that may be defined as a set of precompiled intellectual property (IP) on the emulation platform, the modular compilation flow compiles the glue circuitry enabling communication between the precompiled IP. Without reconfigurable sockets, at least all FPGAs at the boundary of IP blocks need to be recompiled, leading to a wait time equal to at least the time for the longest FPGA to compile. If configurable sockets are supported by the emulation technology, then no recompilation may be necessary—a significant improvement in executing an emulation design change. In other words, the one or more FPGA routing sockets may be recompiled, but the one or more FPGA routing sockets being recompiled may not include portions of the multitude of FPGAs that may not be recompiled at a border of one or more blocks precompiled before the compiling of the plurality of FPGAs.

Moreover, FPGA vendors may typically provide what is called "engineering change order" (ECO) capabilities that allow direct editing to bitstream images to incorporate small scale changes. ECO is much faster than recompiling a whole FPGA. Embodiments of the current invention may increase the possibility of using ECO to implement small scale changes in a DUT. Further, reducing or eliminating the number FPGAs to recompile also reduces the probability of a failing compilation since not all FPGA compilation jobs are successful, even after a small change. Hence, configurable sockets may also provide more reliable compilations, which increase the probability of successful emulations through successive revisions to the DUT. Embodiments of the present invention thus provide for faster emulation implementation (i.e. how long it takes to get the emulator set up) when the design is changed in multi-FPGA emulation hardware.

Another way to avoid FPGA recompilation due to changes in global routing is to forbid changes to global routing in the first place. Forbidding global rerouting prevents socket recompilation which, in-turn prevents FPGA recompilation. However, the problem with forbidding global rerouting is quick degradation of emulation speed, since each change keeping the original global routing results in a new solution that is sub-optimal compared to the previous initial compilation from scratch. Therefore, embodiments of the present invention further provide for faster emulation speed (i.e. how fast the emulator runs) when the design is changed in multi-FPGA emulation hardware.

Figure 1:
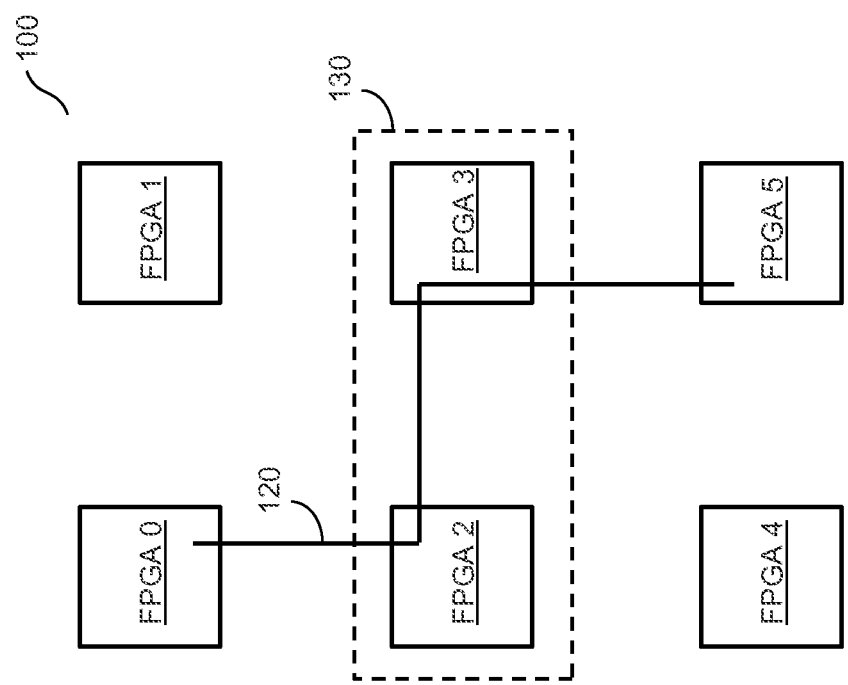
FIG. 1 depicts a simplified exemplary block diagram for an emulation platform including six FPGAs and an initial global net, in accordance with one embodiment of the present invention.

FIG. 1 depicts a simplified exemplary block diagram for an emulation platform 100 including six FPGAs, FPGA 0-FPGA 5, and an initial global net 120 traversing four FPGAs, FPGA 0, FPGA 2, FPGA 3, and FPGA 5, in accordance with one embodiment of the present invention. Emulation platform 100 further includes an IP block 130 configured in FPGA 2 and FPGA 3. It is understood that initial global net 120 may be but one of a multitude of nets routed among FPGA 0-FPGA 5.

Figure 2:
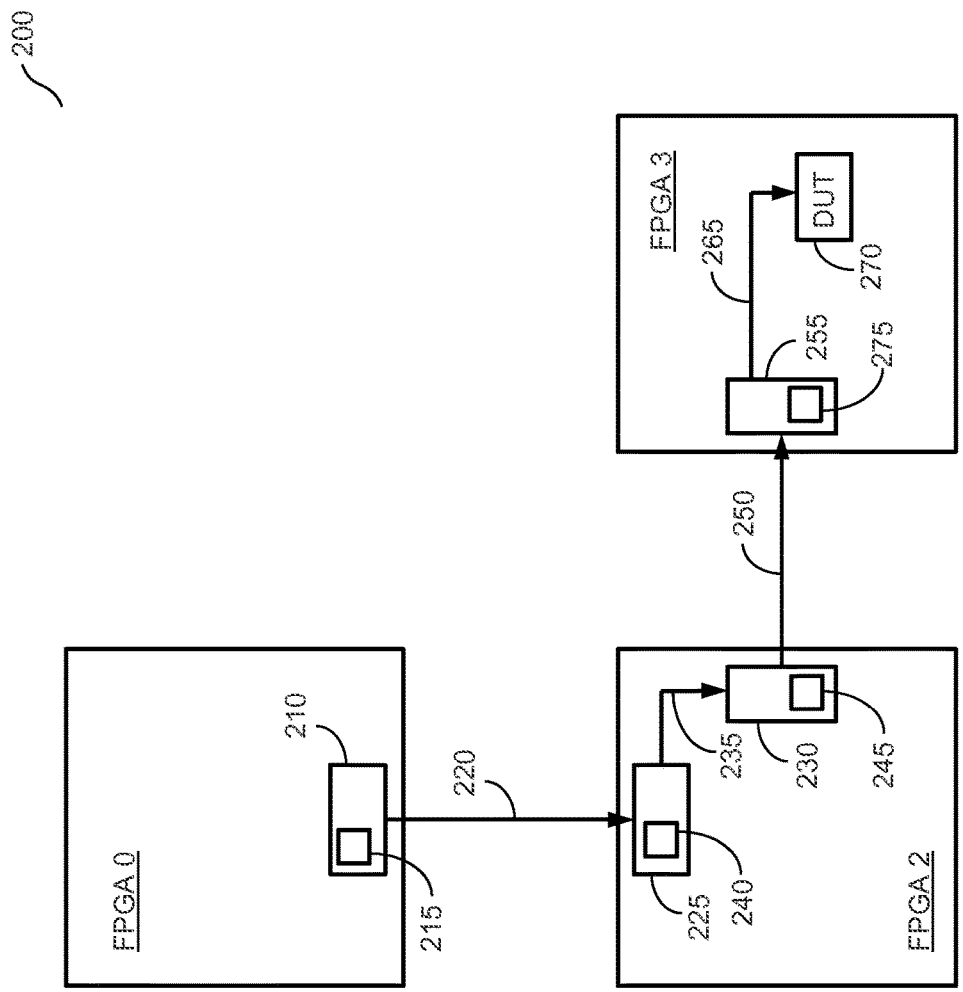
FIG. 2 depicts a simplified exemplary block diagram for a portion of the emulation platform depicted in FIG. 1, in accordance with one embodiment of the present invention.

FIG. 2 depicts a simplified exemplary block diagram for a portion 200 of the emulation platform 100 depicted in FIG. 1, in accordance with one embodiment of the present invention. Portion 200 of the emulation platform 100 may include FPGA 0, FPGA 2, FPGA 3, and a portion of initial global net 120. FPGA 0 may include an output socket 210 connected to FPGA 2, which transfers signals on a portion 220 of the global net to FPGA 2. Output socket 210 may include a state machine 215 to handle the proper ordering of signal transmission because multiple signals may be sent one at a time using a time-multiplexing technique.

FPGA 2 may include an input socket 225 and an output socket 230. Input socket 225 may be connected to FPGA 0. Input socket 225 may transfer signals on a portion 235 of the global net to output socket 230, which may be connected to FPGA 3. Input socket 225 and output socket 230 may include state machines 240, 245 to respectively handle the proper ordering of signal reception and transmission because multiple signals may be sent using a time-multiplexing technique. State machine 245 may write the correct signals on a portion 250 of the global net to connect from FPGA 2 to FPGA 3.

Similarly, FPGA 3 includes an input socket 255 and a DUT 270. Input socket 255 may be connected to FPGA 2. Input socket 255 may transfer signals on a portion 265 of the global net to the correct input pin of the DUT 270. Hence, another state machine 275 included in input socket 255 may handle proper ordering and writing of signals to the correct input of the DUT 270. State machines 215, 240, 245, 275 are adapted so that transmission happens with correct routing, since usually many signals are transmitted through a given socket.

FIG. 3 depicts a simplified exemplary block diagram for an emulation platform 300 with a rerouted global net 310 depicted as a dotted and dashed line, in accordance with one embodiment of the present invention. Emulation platform 300 may include similar features as emulation platform 100 depicted in FIG. 1. FIG. 3 depicts an embodiment where the user makes a local change in the netlist of IP block 130 creating IP block 330 that impacts connectivity between two circuit constructs, which changes a number of bits transferred between FPGA 2 and FPGA 3.

In general, using an incremental compilation flow, global routing will change socket configuration of the unchanged FPGAs if any change to an IP block changes the number of bits or wires between any of the FPGAs of an IP block, and there is a global route traversing the multiple FPGAs emulating that IP block. Global routing may re-compute the best solution, for example, for speed of operation of the emulation, and/or balancing global nets traversing FPGA 2 and FPGA 3. Global net 120 previously routed through FPGAs (0; 2; 3; 5) as depicted in FIG. 1 may now be re-routed as depicted in FIG. 3 by rerouted global net 310 routed through FPGAs (0; 2; 4; 5). In other words, global net 120 depicted in FIG. 1 is replaced by rerouted global net 310 as depicted in FIG. 3. This global net rerouting in turn changes the socket configuration of FPGA 0, FPGA 4, and FPGA 5, which, in conventional systems, triggers each of their recompilations, while the DUT they emulate may not have been changed by the designer. According to the embodiments described in more detail below, FPGA routing sockets may be configurable without requiring time consuming recompilation of the remaining other portion of the FPGA containing that socket, and the new global route may be configured, achieving the best emulation speed. In other words, the one or more FPGA routing sockets may be recompiled, but some others of the multitude of FPGAs are not recompiled.

Figure 4:
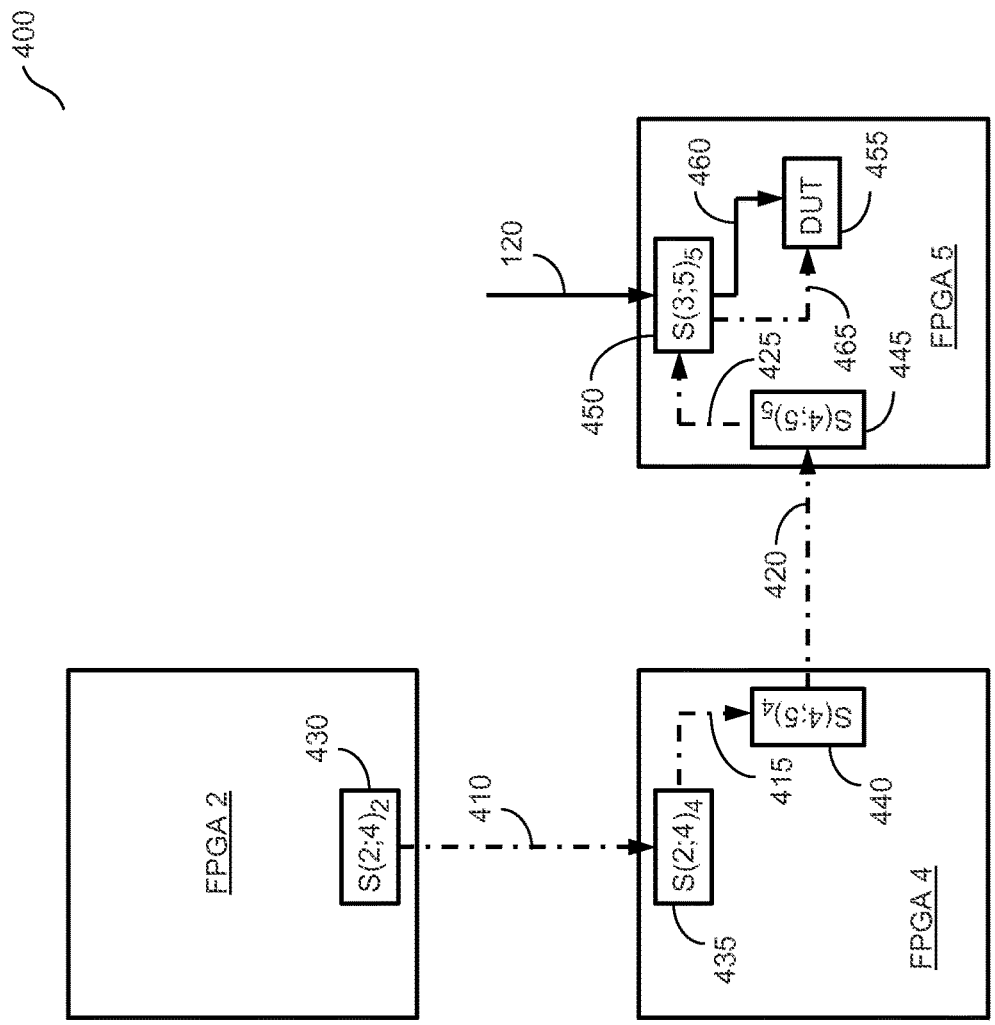
FIG. 4 depicts a simplified exemplary block diagram for a portion of the emulation platform depicted in FIG. 3, in accordance with one embodiment of the present invention.

FIG. 4 depicts a simplified exemplary block diagram for a portion 400 of the emulation platform 300 depicted in FIG. 3, in accordance with one embodiment of the present invention. Portion 400 of emulation platform 300 includes FPGA 2, FPGA 4, FPGA 5, and a multitude of portions 410, 415, 420, 425 of the rerouted global net depicted as dotted and dashed lines. A portion of the original global net 120 is shown as a solid line for reference only and is understood to be not included in portion 400 of emulation platform 300. Portion 400 of emulation platform 300 may include one or more spare routing resources that may be allocated to one or more FPGA routing sockets 430, 435, 440, 445, 450 when compiling a multitude of FPGAs disposed in the emulator to emulate the DUT. In other words, input and output FPGA routing sockets may be adapted to have spare routing resources to support future potential netlist changes. The one or more spare routing resources may provide new nets to be routed through the socket.

For example, portions 410, 415, 420, 425 of the rerouted global net may correspond to portions of new nets that were not originally used by the first initial compilation. Further, portions 410, 415, 420, 425 of the rerouted global net may be connected to spare routing resources in the routing sockets 430, 435, 440, 445, 450 respectively connected thereto. In one embodiment, spare routing resources may include spare circuitry on the FPGA allocated for use as a socket, a state machine associated with a socket, a FPGA I/O, a wire trace such as portions 415, 425 of the rerouted global net and/or one or more spare traces on the circuit board interconnecting different FPGAs such as portions 410, 420 of the rerouted global net. In one embodiment, these spare routing resources may be allocated during the first initial compilation, so that future compilations may be able to use the extra resources when needed. The one or more spare routing resources may be used to provide one or more routings in response to one or more changes in the DUT. The amount of spare or extra resources may be a trade-off between hardware consumption versus emulation performance during future compilations, as described below. Input and output sockets may be capable of transferring the DUT signal data to which they are originally configured, plus a finite amount of extra signal transfer capabilities to cope for future routing needs.

In one embodiment, the one or more FPGA routing sockets may include an output socket 430 in FPGA 2 and an input socket 435 in FPGA 4. The one or more spare routing resources may be used to provide one or more routings, such as portion 410 of the rerouted global net, from output socket 430 to input socket 435. In other words, output socket 430 may be adapted to route one or more spare nets, such as portion 410 of the rerouted global net, to an input socket 435 of FPGA 4. Output sockets 430, 435 may connect FPGA 2 to FPGA 4.

In one embodiment, the one or more FPGA routing sockets may include an input socket 435 in FPGA 4 and an output socket 440 in the same FPGA 4. The one or more spare routing resources may be used to provide one or more routings, such as portion 415 of the rerouted global net, from input socket 435 to output socket 440. In other words, input socket 435 may be adapted to route one or more spare nets, such as portion 415 of the rerouted global net, to an output socket 440 of the same FPGA 4. Input socket 435 may connect FPGA 2 to FPGA 4. Output socket 440 may connect FPGA 4 to input socket 445 in FPGA 5 with spare routing portion 420 of the rerouted global net.

In one embodiment, the one or more FPGA routing sockets include an input socket 445 in FPGA 5 and a second input socket 450 in the same FPGA 5. The one or more spare routing resources may be used to provide one or more routings, such as portion 425 of the rerouted global net, from input socket 445 to input socket 450. In other words, input socket 445 may be adapted to route one or more spare nets, such as portion 425 of the rerouted global net, to a different input socket 450 of the same FPGA 5. In one embodiment, the internal state machine of input sockets 445, 450 may be configured at compilation runtime to route extra nets to specific inputs of the portions of the DUT synthesized in FPGA 5. In another embodiment, the internal state machine of input sockets 445, 450 may be configured by changing the bitstream to route extra nets to specific inputs of the portions of the DUT synthesized in FPGA 5. In one embodiment, the original global route 120 connected input socket 450 to the correct input net of a portion 455 of the DUT, and the new route may reach the same portion 455 of the DUT via the original portion 455 of the global net 120.

In one embodiment, the one or more FPGA routing sockets include an input socket 450 in FPGA 5. The one or more spare routing resources may be used to provide one or more routings, such as portion 465 of the rerouted global net, from input socket 450 to a portion 455 of the emulated circuit design. In other words, input socket 450 may route extra nets 465 to any DUT signal that input socket 450 is connected to. An input socket may be connected to one or more DUT nets, so that communication between FPGAs reaches the correct destinations in the DUT. In one embodiment, input socket 450 of FPGA 5 may be connected to a DUT net n, which may be the destination of the global net. Global routing generated by the initial compilation created a connection between input socket 450 and net n. The new routing requires input socket 450 to now be routed to a spare net portion 425 coming from input socket 445 to be routed in place of the original input 120. Hence, input socket 450 is routed via spare nets coming from other sockets in same FPGA to any DUT signal input socket 450 is connected to.

Thus, new global routes may be created without recompiling entire FPGAs, but instead by configuring the relevant sockets at compilation runtime.

Some of the embodiments described above configure connections between sockets of the same FPGA, which may be done in one embodiment by chaining sockets one after the other. Each socket may be adapted to include hardware to connect to a neighbor socket such that routing resources inside the FPGA may not be substantially impacted. However, chaining sockets may reduce emulation speed because multiple hops may be required to reach the desired socket, especially on FPGAs including many sockets.

Figure 5:
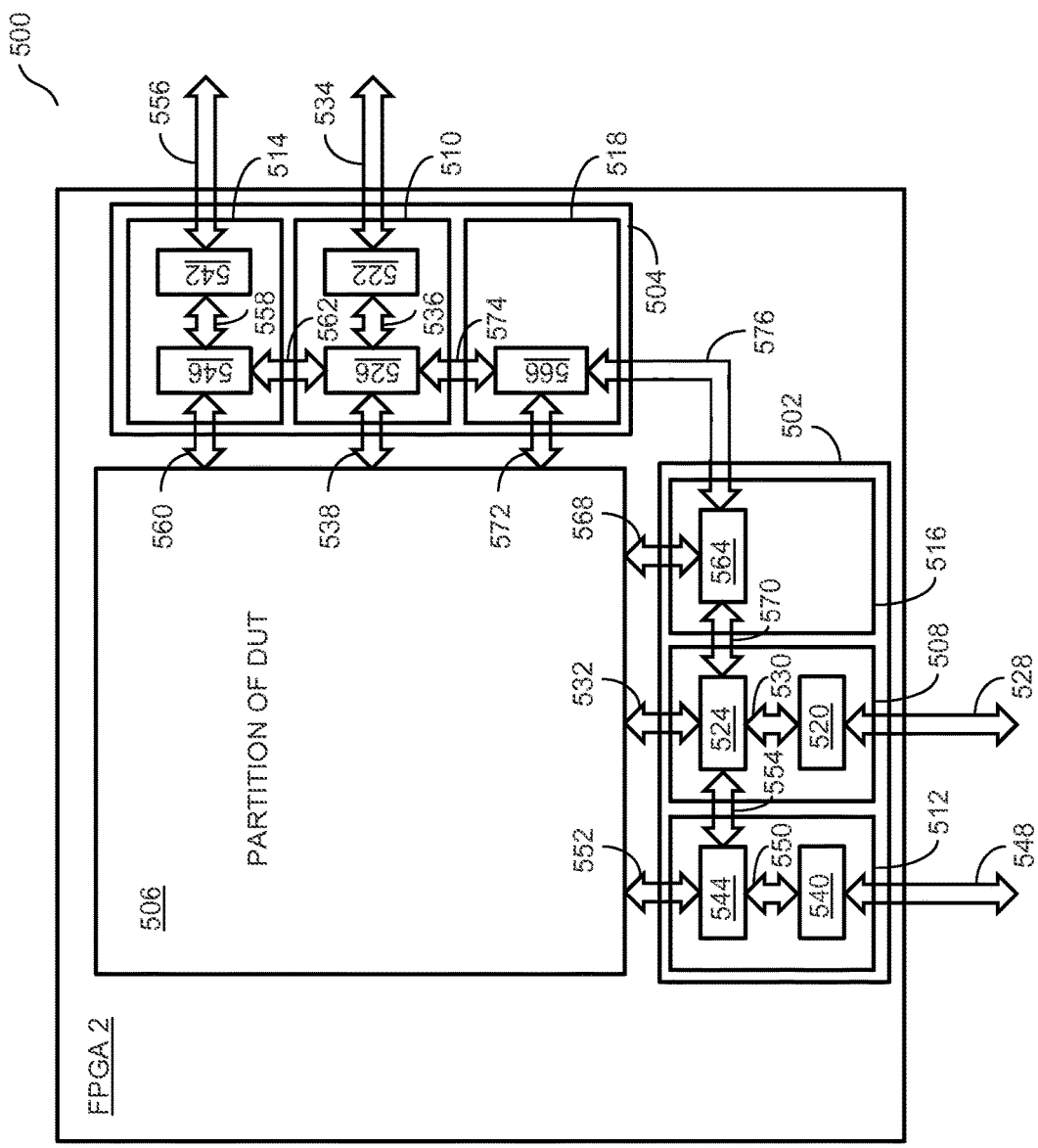
FIG. 5 depicts a simplified exemplary block diagram for a portion of the emulation platform depicted in FIG. 3 including bidirectional sockets in an FPGA with spare routing resources, in accordance with one embodiment of the present invention.

FIG. 5 depicts a simplified exemplary block diagram for a portion 500 of the emulation platform depicted in FIG. 3 including bidirectional sockets 502, 504 in FPGA 2 with spare routing resources, in accordance with one embodiment of the present invention. As described with further specificity below, the routing resources may be connected as part of a compiling or recompiling operation. FPGA 2 may include one or more bidirectional sockets 502, 504, and a partition 506 of the DUT. Bidirectional sockets 502, 504 may include in-use inter-FPGA routing resources 508, 510, spare inter-FPGA routing resources 512, 514, and spare intra-FPGA routing resources 516, 518 respectively. In-use inter-FPGA routing resources 508, 510 may include in-use configurable I/O 520, 522, in-use configurable logic 524, 526, and in-use configurable interconnect (528, 530, 532), (534, 536, 538) respectively. Spare inter-FPGA routing resources 512, 514 may include spare configurable I/O 540, 542, spare configurable logic 544, 546, and spare configurable interconnect (548, 550, 552, 554), (556, 558, 560, 562) respectively. Spare intra-FPGA routing resources 516, 518 may include spare configurable logic 564, 566, and spare configurable interconnect (568, 570), (572, 574) respectively.

In-use configurable interconnect 528 may connect in-use configurable I/O 520 to an in-use configurable I/O in a bidirectional socket in FPGA 4 (not shown) via a multitude of in-use pins and a multitude of corresponding in-use traces on the printed circuit board (not shown). In-use configurable interconnect 534 may connect in-use configurable I/O 522 to an in-use configurable I/O in a bidirectional socket in FPGA 3 (not shown) via a multitude of in-use pins and a multitude of corresponding in-use traces on the printed circuit board (not shown). In-use configurable I/O 520, 522 may be connected to in-use configurable logic 524, 526 via in-use configurable interconnect 530, 536 respectively. In-use configurable logic 524, 526 may be connected to partition 506 of the DUT via in-use configurable interconnect 532, 538 respectively.

Spare configurable interconnect 548 may connect spare configurable I/O 540 to a spare configurable I/O in the bidirectional socket in FPGA 4 (not shown) via a multitude of spare pins and a multitude of corresponding spare traces on the printed circuit board (not shown). Spare configurable interconnect 556 may connect spare configurable I/O 542 to a spare configurable I/O in a bidirectional socket in FPGA 3 (not shown) via a multitude of spare pins and a multitude of corresponding spare traces on the printed circuit board (not shown). Spare configurable I/O 540, 542 may be connected to spare configurable logic 544, 546 via spare configurable interconnect 550, 558 respectively. Spare configurable logic 544, 546, 564, 566 may be connected to partition 506 of the DUT via spare configurable interconnect 552, 560, 568, 572 respectively.

In one embodiment, in-use configurable I/O 520, 522, spare configurable I/O 540, 542, in-use configurable interconnect 528, 534, and spare configurable interconnect 548, 556 may be separate resources since a new global routing may require more nets to be routed in addition to the existing nets in a given socket. For example, in-use configurable I/O 520, in-use configurable logic 524, and in-use configurable interconnect 528, 530, 532 may be allocated for use by the initial full compilation of FPGA 2, while spare configurable I/O 540, spare configurable logic 544, and spare configurable interconnect 548, 550, 552 may be allocated by the initial full compilation of FPGA 2 for future use in the event an additional global net is needed between FPGA 2 and FPGA 4.

Off-chip resources may involve hardwired physical connections such as pins on FPGA 2 and FPGA 4 and/or associated traces on the circuit board that are not configurable. In one embodiment, spare configurable logic 544 may be adapted to modify the socket's state-machine so that the time-multiplexing used by socket 502 may transmit the newly reconfigured signals one at a time over the same non-configurable hardwired physical connections when the global routing is changed. The spare configurable logic in associated receiving socket in FPGA 4 is analogously modified to receive the newly reconfigured time-multiplexed signals. In another embodiment, a multitude of spare hardwired traces may be provided on the circuit board with associated spare hardwired I/O resources in the multitude of FPGAs to provide additional inter-FPGA global routing capacity. The spare routing interconnect and spare configurable logic may then be used to route signals over additional hardwired resources.

Intra-FPGA global net routing may be provided via chaining sockets as described above. Spare configurable logic 544, 546 may be connected to in-use configurable logic 524, 526 via spare configurable interconnect 554, 562 respectively. Spare configurable logic 564, 566 may be connected to in-use configurable logic 524, 526 via spare configurable interconnect 570, 574 respectively. Spare configurable logic 564 may be connected to spare configurable logic 566 via spare configurable interconnect 576. Intra-FPGA global net routing may be provided via chaining sockets as described above. For example, spare configurable logic 564, 566, and spare configurable interconnect 570, 574, 576 may be allocated by the initial full compilation of FPGA 2 for future use in the event an additional global net may need to be routed between bidirectional socket 502 and bidirectional socket 504 for intra-FPGA routing. It is understood that additional configurable interconnect may be provided to chain in series any number of bidirectional sockets within an FPGA.

Figure 6:
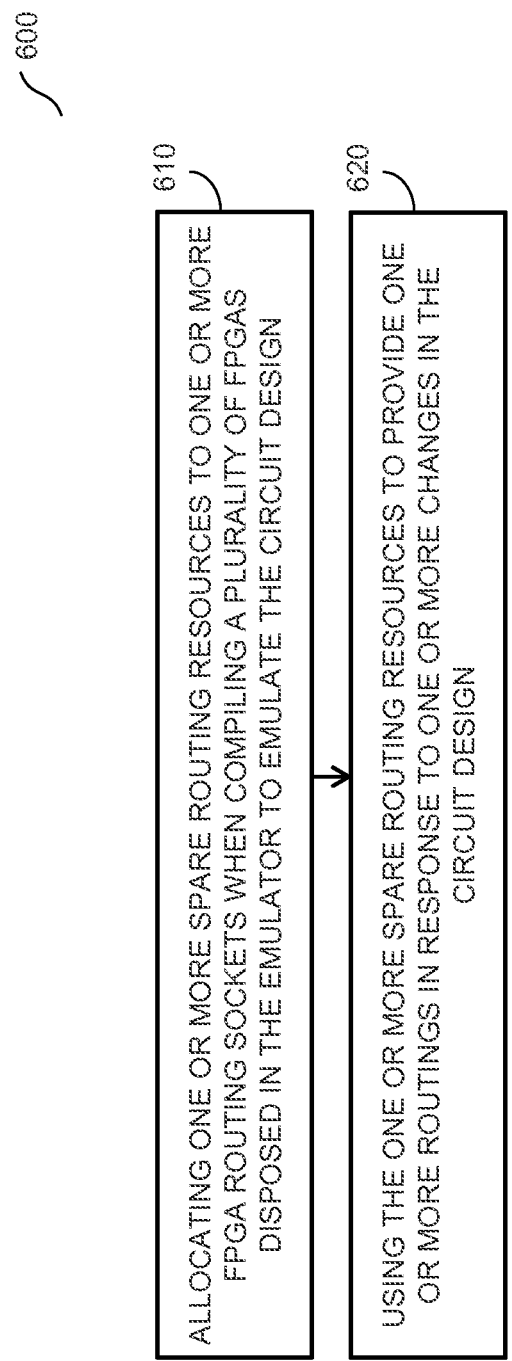
FIG. 6 depicts a simplified exemplary method of emulating a circuit design using an emulator, in accordance with one embodiment of the present invention.

FIG. 6 depicts a simplified exemplary method 600 of emulating a circuit design using an emulator, in accordance with one embodiment of the present invention. Referring simultaneously to FIG. 5 and FIG. 6, method 600 includes allocating 610 one or more spare routing resources to one or more FPGA routing sockets when compiling a plurality of FPGAs disposed in the emulator to emulate the circuit design. Method 600 further includes using 620 the one or more spare routing resources to provide one or more routings, for example, in response to one or more changes in the circuit design.

Figure 7:
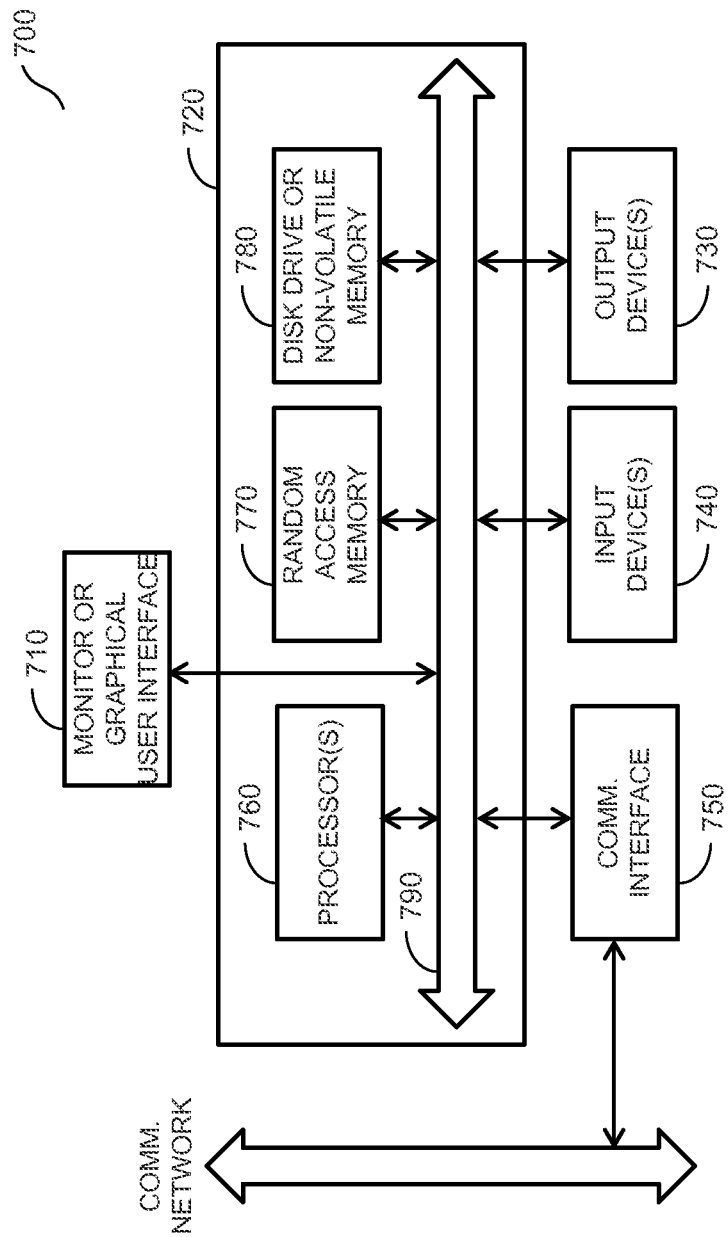
FIG. 7 is a block diagram of a computer system that may incorporate embodiments of the present invention.

FIG. 7 is a block diagram of a computer system that may incorporate embodiments of the present invention. FIG. 7 is merely illustrative of an embodiment incorporating the present invention and does not limit the scope of the invention as recited in the claims. One of ordinary skill in the art would recognize other variations, modifications, and alternatives.

In one embodiment, computer system 700 typically includes a monitor 710, a computer 720, user output devices 730, user input devices 740, communications interface 750, and the like.

As shown in FIG. 7, computer 720 may include a processor(s) 760 that communicates with a number of peripheral devices via a bus subsystem 790. These peripheral devices may include user output devices 730, user input devices 740, communications interface 750, and a storage subsystem, such as random access memory (RAM) 770 and disk drive 780.

User input devices 730 include all possible types of devices and mechanisms for inputting information to computer system 720. These may include a keyboard, a keypad, a touch screen incorporated into the display, audio input devices such as voice recognition systems, microphones, and other types of input devices. In various embodiments, user input devices 730 are typically embodied as a computer mouse, a trackball, a track pad, a joystick, wireless remote, drawing tablet, voice command system, eye tracking system, and the like. User input devices 730 typically allow a user to select objects, icons, text and the like that appear on the monitor 710 via a command such as a click of a button or the like.

User output devices 740 include all possible types of devices and mechanisms for outputting information from computer 720. These may include a display (e.g., monitor 710), non-visual displays such as audio output devices, etc.

Communications interface 750 provides an interface to other communication networks and devices. Communications interface 750 may serve as an interface for receiving data from and transmitting data to other systems. Embodiments of communications interface 750 typically include an Ethernet card, a modem (telephone, satellite, cable, ISDN), (asynchronous) digital subscriber line (DSL) unit, FireWire interface, USB interface, and the like. For example, communications interface 750 may be coupled to a computer network, to a FireWire bus, or the like. In other embodiments, communications interfaces 750 may be physically integrated on the motherboard of computer 720, and may be a software program, such as soft DSL, or the like.

In various embodiments, computer system 700 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 720 includes one or more Xeon microprocessors from Intel as processor(s) 760. Further, one embodiment, computer 720 includes a UNIX-based operating system.

RAM 770 and disk drive 780 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 770 and disk drive 780 may be configured to store the basic programming and data constructs that provide the functionality of the present invention.

Software code modules and instructions that provide the functionality of the present invention may be stored in RAM 770 and disk drive 780. These software modules may be executed by processor(s) 760. RAM 770 and disk drive 780 may also provide a repository for storing data used in accordance with the present invention.

RAM 770 and disk drive 780 may include a number of memories including a main random access memory (RAM) for storage of instructions and data during program execution and a read only memory (ROM) in which fixed non-transitory instructions are stored. RAM 770 and disk drive 780 may include a file storage subsystem providing persistent (non-volatile) storage for program and data files. RAM 770 and disk drive 780 may also include removable storage systems, such as removable flash memory.

Bus subsystem 790 provides a mechanism for letting the various components and subsystems of computer 720 communicate with each other as intended. Although bus subsystem 790 is shown schematically as a single bus, alternative embodiments of the bus subsystem may utilize multiple busses.

FIG. 7 is representative of a computer system capable of embodying the compilation portion of the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. However, it will be evident that various modifications and changes may be made thereunto without departing from the broader spirit and scope of the invention as set forth in the claims. In addition, the technique and system of the present invention is suitable for use with a wide variety of FPGA platforms and methodologies for designing, testing, and/or manufacturing systems capable of being emulated by a multitude of FPGAs. Embodiments of the present invention have been described using six FPGAs by way of example only, however the invention is not limited by the number of FPGAs used over two FPGAs. Embodiments of the present invention have been described using a number of sockets in an FPGA by way of example only, however the invention is not limited by the number of sockets in an FPGA. The scope of the invention should, therefore, be determined not with reference to the above description, but instead should be determined with reference to the pending claims along with their full scope or equivalents.

What is claimed is:

1. A method of emulating a circuit design using an emulator, the method comprising:
   allocating one or more configurable spare routing resources to one or more field programmable gate array (FPGA) routing sockets when compiling a plurality of FPGAs disposed in the emulator in preparation for emulating the circuit design, said configurable spare routing resources being disposed within the one or more FPGAs; and
   configuring the one or more spare routing resources to provide one or more routings among the FPGAs in response to one or more changes made to the circuit design.

2. The method of claim 1, wherein using the spare routing resources comprises:
   recompiling the one or more FPGA routing sockets.

3. The method of claim 1, wherein configuring the spare routing resources comprises:
   directly editing a bit stream image.

4. The method of claim 1, wherein the one or more routings include a route from a first FPGA to a second FPGA.

5. The method of claim 1, wherein the one or more routings include a route from a first portion of a first FPGA to a second portion of the first FPGA, the second portion being different from the first portion.

6. The method of claim 1, wherein the one or more FPGA routing sockets include a first input socket in a first FPGA and a first output socket in the first FPGA, the method comprising configuring the one or more spare routing resources to provide one or more routings from the first input socket to the first output socket.

7. The method of claim 1, wherein the one or more FPGA routing sockets include a first input socket in a first FPGA and a second input socket in the first FPGA, the method comprising configuring the one or more spare routing resources to provide one or more routings from the first input socket to the second input socket.

8. The method of claim 1, wherein the one or more FPGA routing sockets include a first input socket in a first FPGA, the method comprising configuring the one or more spare routing resources to provide one or more routings from the first input socket to the emulated circuit design.

9. The method of claim 1, wherein the one or more FPGA routing sockets include a first output socket in a first FPGA and a first input socket in a second FPGA, the method comprising configuring the one or more spare routing resources to provide one or more routings from the first output socket to the first input socket.

10. The method of claim 1, wherein allocating includes allocating the one or more spare routing resources for future use during a future compilation of the one or more FPGA routing sockets.

11. The method of claim 10, wherein the one or more spare routing resources are configured in response to one or more changes in the circuit design made after the first compilation of the one or more FPGA routing sockets.

12. The method of claim 1, wherein the one or more field programmable gate array (FPGA) routing sockets are not a part of the circuit design.

13. The method of claim 1, wherein the one or more spare routing resources includes one or more spare logic circuits.

14. The method of claim 1, wherein the one or more spare routing resources includes one or more spare interconnects.

15. A system comprising a plurality of field programmable gate arrays (FPGAs) and operative to:
   compile the plurality of FPGAs in preparation for emulating a circuit design, while the system is invoked to compile the circuit design;
   allocate one or more configurable spare routing resources to one or more FPGA routing sockets, said configurable spare routing resources being disposed within the plurality of FPGAs; and
   configure the one or more spare routing resources to provide one or more routings in response to one or more changes made to the circuit design.

16. The system of claim 15, wherein the system is further operative to:
   recompile the one or more FPGA routing sockets.

17. The system of claim 15, wherein the system is further operative to:
   directly edit a bit stream image.

18. The system of claim 15, wherein the one or more routings include a route from a first FPGA to a second FPGA.

19. The system of claim 15, wherein the one or more routings include a route from a first portion of a first FPGA to a second portion of the first FPGA, the second portion being different from the first portion.

20. The system of claim 15, wherein the one or more FPGA routing sockets include a first input socket in a first FPGA and a first output socket in the first FPGA, wherein the system is further operative to configure the one or more spare routing resources to provide one or more routings from the first input socket to the first output socket.

21. The system of claim 15, wherein the one or more FPGA routing sockets include a first input socket in a first FPGA and a second input socket in the first FPGA, wherein the system is further operative to configure the one or more spare routing resources to provide one or more routings from the first input socket to the second input socket.

22. The system of claim 15, wherein the one or more FPGA routing sockets include a first input socket in a first FPGA, wherein the system is further operative to configure the one or more spare routing resources to provide one or more routings from the first input socket to the emulated circuit design.

23. The system of claim 15, wherein the one or more FPGA routing sockets include a first output socket in a first FPGA and a first input socket in a second FPGA, wherein the system is further operative to configure the one or more spare routing resources to provide one or more routings from the first output socket to the first input socket.

24. The system of claim 15, wherein the system is further operative to allocate the one or more spare routing resources for future configuration during a future compilation of the one or more FPGA routing sockets.

25. The system of claim 24, wherein the system is further operative to configure the one or more spare routing resources in response to one or more changes in the circuit design made after the first compilation of the one or more FPGA routing sockets.

26. The system of claim 15, wherein the one or more FPGA routing sockets are not a part of the circuit design.

27. The system of claim 15, wherein the one or more spare routing resources includes one or more spare logic circuits.

28. The system of claim 15, wherein the one or more spare routing resources includes one or more spare interconnects.

29. A non-transitory computer readable storage medium comprising instructions that when executed by a processor cause the processor to:

compile the plurality of FPGAs in preparation for emulating a circuit design, while the system is invoked to compile the circuit design;

allocate one or more configurable spare routing resources to one or more FPGA routing sockets, said configurable spare routing resources being disposed within the plurality of FPGAs; and configure the one or more spare routing resources to provide one or more routings in response to one or more changes made to the circuit design.

30. The non-transitory computer readable storage medium of claim 29 further comprising instructions to:
recompile the one or more FPGA routing sockets.

31. The non-transitory computer readable storage medium of claim 29 further comprising instructions to:
directly edit a bit stream image.

32. The non-transitory computer readable storage medium of claim 29, wherein the one or more routings include a route from a first FPGA to a second FPGA.

33. The non-transitory computer readable storage medium of claim 29, wherein the one or more routings include a route from a first portion of a first FPGA to a second portion of the first FPGA, the second portion being different from the first portion.

34. The non-transitory computer readable storage medium of claim 29, wherein the one or more FPGA routing sockets include a first input socket in a first FPGA and a first output socket in the first FPGA, wherein the non-transitory computer readable storage medium is further comprising instructions to configure the one or more spare routing resources to provide one or more routings from the first input socket to the first output socket.

35. The non-transitory computer readable storage medium of claim 29, wherein the one or more FPGA routing sockets include a first input socket in a first FPGA and a second input socket in the first FPGA, wherein the non-transitory computer readable storage medium is further comprising instructions to configure the one or more spare routing resources to provide one or more routings from the first input socket to the second input socket.

36. The non-transitory computer readable storage medium of claim 29, wherein the one or more FPGA routing sockets include a first input socket in a first FPGA, wherein the non-transitory computer readable storage medium is further comprising instructions to provide one or more routings from the first input socket to the emulated circuit design.

37. The non-transitory computer readable storage medium of claim 29, wherein the one or more FPGA routing sockets include a first output socket in a first FPGA and a first input socket in a second FPGA, wherein the non-transitory computer readable storage medium is further comprising instructions to configure the one or more spare routing resources to provide one or more routings from the first output socket to the first input socket.

38. The non-transitory computer readable storage medium of claim 29 further comprising instructions to allocate the one or more spare routing resources for future configuration during a future compilation of the one or more FPGA routing sockets.

39. The non-transitory computer readable storage medium of claim 38 further comprising instructions to configure one or more spare routing resources in response to the one or more changes in the circuit design made after the first compilation of the one or more FPGA routing sockets.

40. The non-transitory computer readable storage medium of claim 29, wherein the one or more FPGA routing sockets are not a part of the circuit design.

41. The non-transitory computer readable storage medium of claim 29, wherein the one or more spare routing resources includes one or more spare logic circuits.

42. The non-transitory computer readable storage medium of claim 29, wherein the one or more spare routing resources includes one or more spare interconnects.

* * * * *